(12) United States Patent
Imai et al.

(10) Patent No.: US 6,555,286 B1
(45) Date of Patent: Apr. 29, 2003

(54) POSITIVE TYPE ACTINIC-RAY-CURABLE DRY FILM AND PATTERN-FORMING METHOD BY USE OF THE SAME

(75) Inventors: Genji Imai, Kanagawa-ken (JP); Takeya Hasegawa, Kanagawa-ken (JP)

(73) Assignee: Kansai Paint Co., Ltd., Hyogo-ken (JP)

( * ) Notice: Subject to any disclaimer, the term of this patent is extended or adjusted under 35 U.S.C. 154(b) by 61 days.

(21) Appl. No.: 09/630,191

(22) Filed: Aug. 1, 2000

(30) Foreign Application Priority Data

Aug. 25, 1999 (JP) .......................... 11-237883
Aug. 25, 1999 (JP) .......................... 11-237884
Aug. 25, 1999 (JP) .......................... 11-237885

(51) Int. Cl.$^7$ .............................................. G03F 7/039
(52) U.S. Cl. ...................... 430/270.1; 430/326; 430/330
(58) Field of Search ...................................... 430/270.1

(56) References Cited

U.S. PATENT DOCUMENTS

| | | | |
|---|---|---|---|
| 5,364,738 A | * 11/1994 | Kondo et al. | ............ 430/270.1 |
| 5,496,678 A | * 3/1996 | Imai et al. | ................... 430/176 |
| 5,939,235 A | * 8/1999 | Kondo et al. | ............ 430/270.1 |
| 5,942,367 A | * 8/1999 | Watanabe et al. | ........ 430/270.1 |

FOREIGN PATENT DOCUMENTS

| | | |
|---|---|---|
| JP | 5-506106 | 9/1993 |
| JP | 6-308733 | 11/1994 |
| JP | 6-313134 | 11/1994 |
| JP | 6-313135 | 11/1994 |
| JP | 6-313136 | 11/1994 |
| JP | 7-146552 | 6/1995 |
| JP | 7-295064 | 11/1995 |

* cited by examiner

*Primary Examiner*—Cynthia Hamilton
(74) *Attorney, Agent, or Firm*—Fisher, Christen & Sabol

(57) ABSTRACT

A positive type actinic ray-developable dry film having, on the surface of a nonactinic ray-developable substrate, a solid positive type actinic ray-developable urethane resin layer formed by coating and heat-crosslinking (1) a resin composition containing ($A_1$) an unsaturated compound, ($B_1$) an acid group-containing urethane resin and (C) a photo-acid generator, (2) a resin composition containing ($A_2$) an unsaturated urethane based compound, ($B_2$) at least one resin selected from the group consisting of (a) a carboxyl group and hydroxyphenyl group-containing polymer, (b) a carboxyl group-containing polymer and (c) a hydroxyphenyl group-containing polymer, and (C) a photo-acid generator, or (3) a resin composition containing ($A_2$) an unsaturated urethane based compound, ($B_1$) an acid group-containing urethane resin, and (C) a photo-acid generator. A method of forming a pattern therefrom.

4 Claims, No Drawings

POSITIVE TYPE ACTINIC-RAY-CURABLE DRY FILM AND PATTERN-FORMING METHOD BY USE OF THE SAME

BACKGROUND OF THE INVENTION (1) Field of the Invention

The present invention relates to a positive type actinic ray-decomposing and developing dry film formed from an actinic ray-decomposing and developing resin composition containing a resin having a urethane linkage, showing high sensitivity and good film-handling properties, and capable of forming a pattern which is useful in the formation of a circuit in an electronic device, a material for use in printing.

(2) Description of Background Art

A method of forming a photo-curable resist film which comprises coating or printing a liquid photo-curable resist composition onto a printed circuit board having a through-hole and/or non-through-hole (hereinafter may be simply referred to as a through-hole) according to a coating or printing method such as spray coating, roll coating, silk screen printing or the like, has well known in the art. However, the above methods had such problems that coating or printing of the liquid resist composition directly onto the printed circuit board makes it impossible to form a satisfactory resist film in the interior of the through-hole, resulting in that partial or complete dissolution in an etching solution of a conductive film such as copper, silver and the like in the interior of the through-hole during an etching step may cause to produce troubles such as breaking and the like.

For the purpose of protecting the through-hole from the etching solution, in the recent years, a positive type film resist formed by coating a positive type photo-decomposing and developing liquid resist composition onto a substrate has been used. As an example of the positive type photo-decomposing and developing liquid resist composition, a visible light-sensitive composition comprising a carboxyl group-containing polymer, a polyvinyl ether compound and a compound producing an acid by decomposition due to irradiation of an actinic ray is disclosed in, for example, Japanese Patent Application Laid-Open Nos. 313134/94, 313135/94, 313136/94, 308733/94, 295064/64, 146552/95, and the like.

The above composition is such a photo-decomposing and developing composition that heating of a coating film formed from the composition takes place crosslinking due to addition reaction between carboxyl group and vinyl ether group so as to be insoluble in a solvent and an aqueous alkali solution, and that irradiation of an actinic ray thereonto and heating thereafter breaks down a crosslinked structure due to a catalytic action of an acid produced so that an irradiated area may be made soluble again in a solvent and an aqueous alkali solution.

However, a positive type dry film formed by a process which comprises coating the above-positive type photo-decomposing and developing composition onto a substrate such as polyethylene terephthalate and the like followed by drying, produced such problems that (1) because of unsatisfactory mechanical properties of the positive type photo-decomposing and developing coating film, cracking and separation from the substrate of the coating film take place on winding a dry film dried and formed as above, resulting in making difficult handling of the dry film, that (2) in a method of forming a positive type photo-decomposing and developing coating film onto the surface of a printed circuit board by use of a dry film, which method comprises facing and folding the positive type photo-decomposing and developing coating film onto the printed circuit board, heating the dry film so as to be laminated and separating the polyethylene terephthalate substrate from the positive type photo-decomposing and developing coating film, because of poor adhesion properties between the positive type photo-decomposing and developing coating film and the substrate, after the above separating step, the positive type photo-decomposing and developing coating film may partly or wholly remain on the surface of the polyethylene terephthalate substrate, and that (3) because of unsatisfactory mechanical properties of the positive type photo-decomposing and developing coating film, an erosion of the coating film with an etching solution may take place to be washed out, resulting in making it impossible to form a fine resist pattern.

As an example of a positive type photo-decomposing and developing dry film, Japanese Patent Application Laid-Open No. 506106/93 discloses a dry film photoresist prepared by forming a solid photo-decomposing and developing layer comprising a polymer having a photo-acid-unstable group and a photo-acid generator onto a flexible thin polymer film substrate. That is, the above dry film is such that the photo-acid-unstable group in the polymer may be decomposed by the action of an acid generated from the photo-acid generator or irradiation, so that an irradiated area only may be dissolved in a developing solution to provide a positive type image, but had such drawbacks as to be unable to form a fine image because of unclear correspondence of nondissolution or dissolution to a nonirradiated coating film area or an irradiated coating film area.

SUMMARY OF THE INVENTION

It is an object of the present invention to provide a positive type actinic ray decomposing and developing dry-film which shows good mechanical properties so as to be easy to handle and is capable of forming a fine resist pattern.

It is another object of the present invention to provide a method of forming a pattern, which is capable of forming a fine resist pattern by use of the above dry film.

That is, firstly the present invention provides a positive type actinic ray decomposing and developing dry film having, on the surface of a nonactinic ray decomposing and developing substrate, a solid positive type actinic ray decomposing and developing urethane resin layer formed by coating and heat-crosslinking (1) a resin composition containing, as essential components, ($A_1$) at least one unsaturated compound selected from the group consisting of a vinyl ether group-containing compound, vinyl ester group-containing compound and propenyl ester group-containing compound, ($_1$) an acid group-containing urethane resin having a weight average molecular weight of 1,000 to 200,000 and an acid group content in the range of 0.5 to 10 equivalents per one kg of the resin, and (C) a photo-acid generator; (2) a resin composition containing, as essential components, ($A_2$) at least one unsaturated urethane based compound selected from the group consisting of a vinyl ether urethane based compound ($B_2$) at least one resin selected from the group consisting of (a) a carboxyl group and hydroxyphenyl group-containing polymer, (b) a carboxyl group-containing polymer and (c) a hydroxyphenyl group-containing polymer, and (C) a photo-acid generator; or (3) a resin composition containing, as essential components, ($A_2$) at least one unsaturated urethane based compound selected from the group consisting of a vinyl ether urethane based compound, vinyl ester urethane based compound and propenyl ester urethane based compound, (B$_1$) an acid group-containing urethane resin having a weight average molecular weight of 1,000 to 200,000 and an acid group content in the range of 0.5 to 10 equivalents per one kg of the resin, and (C) a photo-acid generator.

Secondly, the present invention provides a method of forming a pattern which comprises the following steps:
(1) applying the positive type actinic ray-decomposing and developing dry film as above described onto the surface of a coating substrate so that the surface of the coating substrate may face to the urethane resin layer of the dry film,
(2) optionally stripping the nonactinic ray-decomposing and developing substrate of the dry film,
(3) irradiating an actinic ray through a mask or directly onto the surface of the dry film so as to obtain an intended pattern, optionally heat treating,
(4) stripping the nonactinic ray-decomposing and developing substrate not stripped in the above step (2),
(5) subjecting the positive type actinic ray-decomposing and developing urethane resin layer to a development treatment, and
(6) removing an unnecessary area of the urethane resin layer to form a resist pattern film, either step (1) or (2) including a step of heat treating.

DETAILED DESCRIPTION OF THE INVENTION

The nonactinic ray-decomposing and developing substrate is such a substrate that, for example, a positive type actinic ray-decomposing and developing resin layer may be fixed onto the substrate and that an application to the surface of a coating Page 6 has been amended as follows:
substrate such as a printed circuit board and the like may easily be carried out. Examples of the substrate may include films of polyethylene terephthalate, aramide, captone, polymethylpentene, polyethylene, polypropylene, and the like. Of these, polyethylene terephthalate film is particularly preferable from the standpoints of cost and provision of a photo-decomposing and developing dry film having good characteristics. For the purpose of making release easy, the above substrates may also include ones treated with a release agent such as silicone, wax, fluorocarbon resin, and the like. The substrate has a film thickness in the range of 1 to 100 µm, particularly 10 to 40 µm. After application, the substrate may be released and removed.

The positive type actinic ray-decomposing and developing resin composition may be coated or printed onto the above substrates according to a roller coating method, spray coating method, silk screen printing method and the like to prepare a photo-decomposing and developing positive type dry film. For the purpose of enhancing release characteristics of the photo-developable resin composition film from the substrate, the substrate may be coated in advance with a release agent such as silicone, wax, and the like. The positive type ray-decomposing and developing resin layer may have a film thickness in the range of usually 1 to 100 µm, particularly 5 to 40 µm.

The resin composition coated or printed on the surface of the substrate may preferably be heated at about 50 to 150° C., preferably about 80 to 120° C. prior to being heat laminated onto the substrate so that a coating layer may be crosslinked. The result is that mechanical properties, such as folding properties and the like, of the photo-decomposing and developing positive type dry film may be improved.

The positive type actinic ray-decomposing and developing resin composition used in the present invention is such that an irradiation of the actinic ray may decompose the resin composition so as to be soluble in a developing solution.

Respective components of the positive type actinic ray-decomposing and developing urethane resin layer used in the dry film of the present invention may be explained hereinafter.

Unsaturated Compound (A$_1$)

The unsaturated compound (A$_1$) is at least one unsaturated compound selected from the group consisting of a vinyl ether group-containing compound, vinyl ester group-containing compound and propenyl ester group-containing compound.

The vinyl ether group-containing compound is a low molecular weight or high molecular weight compound having about 1 to 4, preferably 2 to 4 of vinyl ether group represented by the formula; —R'—O—CH=CH$_2$, wherein R' represents a straight chain or branched chain alkylene group having 1 to 6 carbon atoms, for example, ethylene, propylene, butylene and the like, in one molecule, and may include, for example, condensation products of halogenated alkyl vinyl ether such as chloroethyl vinyl ether and the like with polyphenol compounds such as bisphenol A, bisphenol F, bisphenol S, phenol resin and the like, or with polyols such as ethylene glycol, propylene glycol, trimethylol propane, pentaerythritol and the like, and the like.

The vinyl ester group-containing compound is a low molecular weight or high molecular weight compound having about 1 (one) to 4, preferably 2 to 4 of vinyl ester group in one molecule, and may include, for example, vinyl acetate, vinyl propionate, vinyl lactate, vinyl butyrate, vinyl isobutyrate, vinyl caproate, vinyl isocaproate, vinyl pivalate, vinyl caprate, Veova monomer (marketed by Shell Kagaku K. K.), and the like.

The propenyl ester group-containing compound is a low molecular weight or high molecular weight compound having about 1 (one) to 4, preferably 2 to 4 of propenyl ester group in one molecule, and may include, for example, isopropenyl acetate, isopropenyl propionate, and the like.

Of the unsaturated compound (A$_1$), use of the vinyl ether group-containing compound is preferable in that an addition reaction between carboxyl group in the resin (B$_1$) and vinyl ether group in the compound (A$_1$) may easily take place.

Unsaturated Polyurethane Compound (A$_2$)

The unsaturated compound (A$_2$) is at least one unsaturated urethane based compound selected from the group consisting of a vinyl ether urethane based compound, vinyl ester urethane based compound and propenyl ester urethane based compound.

The vinyl ether urethane based compound is an unsaturated compound having about 1 to 4, preferably 2 to 4 of an unsaturated ether group such as vinyl ether group represented by the formula: —R'—O—CH=CH$_2$, wherein R' represents a straight chain or branched chain alkylene group having 1 to 6 carbon atoms, for example, ethylene, propylene, butylene and the like, 1-propenyl ether group, butenyl ether group and the like in one molecule, and having at least one urethane linkage in one molecule, and further may include, for example, reaction products of the following polyisocyanate compounds with, optionally the above hydroxyl group-containing compound containing at least two hydroxyl groups in one molecule, and hydroxyalkyl vinyl ether such as hydroxyethyl vinyl ether and the like; condensation products of polyphenol compounds such as biephenol A, bisphenol F, bisphenol S, phenol resin and the like, polyols such as ethylene glycol, propylene glycol, trimethylol propane, pentaerythritol and the like, and the following polyisocyanate compounds with halogenated alkyl vinyl ether such as chloroethyl vinyl ether and the like, and the like. Of these, the condensation product of the polyphenol compound with the halogenated alkyl vinyl ether and the reaction product of the polyisocyanate compound having an aromatic ring with the hydroxyalkyl vinyl ether are preferable from the standpoints of anti-etching properties, precision of a pattern to be formed, and the like.

The vinyl ester urethane based compound is a low molecular weight or high molecular weight compound having about 1 (one) to 4, preferably 2 to 4 of vinyl ester group in one molecule and at least one urethane linkage in one molecule, and may include, for example, reaction products of the following polyisocyanate compound, optionally a hydroxyl group-containing compound containing at least two hydroxyl groups in one molecule, and a hydroxyvinyl ester such as vinyl lactate and the like.

The propenyl ester urethane based compound is a low molecular weight or high molecular weight compound having about 1 (one) to 4, preferably 2 to 4 of propenyl ester group in one molecule, and at least one urethane linkage in one molecule, and may include, for example, the following polyisocyanate compound, optionally a hydroxyl group-containing compound containing at least two hydroxyl groups in one molecule, and hydroxypropenyl ester.

Of the unsaturated compound ($A_2$), use of the vinyl ether urethane based compound is preferable in that an addition reaction between carboxyl group in the resin ($B_1$) or ($B_2$) and vinyl ether group in the compound ($A_2$) may easily take place.

Examples of the above polyisocyanate compound may include aliphatic diisocyanate compound such as hexamethylene diisocyanate, trimethylenediisocyanate, 1,4-tetramethylene-diisocyanate, pentamethylenediisocyanate, 1,2-propylenediisocyanate, 1,2-butylenediisocyanate, trimethylhexamethylene diisocyanate, dimer acid diisocyanate, lysinediisocyanate, 2,3-butylenediisocyanate, 1,3-butylene-diisocyanate and the like; alicyclic diisocyanate compound such as isophoronediisocyanate, 4,4'-methylene bis (cyclohexylisocyanate), methylcyclohexane-2,4-(or -2,6-) diisocyanate, 1,3-(or 1,4-)-di(isocyanatomethyl) cyclohexane, 1,4-cyclohexanediisocyanate, 1,3-cyclopentanediisocyanate, 1,2-cyclohexanediisocyanate and the like; aromatic diisocyanate compound such as xylylenediisocyanate, methaxylylene diisocyanate, tetramethylxlylenediisocyanate, tolylenediisocyanate, 4,4'-diphenyl-methanediisocyanate, 1,5-naphthalenediisocyanate, 1,4-naphthalenediisocyanate, 4,4'-toluidinediisocyanate, 4,4'-diphenyletherdiisocyanate, (m- or p-)phenylenediisocyanate, 4,4'-biphenylenediisocyanate, 3,3'-dimethyl-4,4'-biphenylenediisocyanate, bis(4-isocyanatophenyl)sulfone, isopropylidene bis(4-phenylisocyanate) and the like; other polyisocyanates, for example, polyisocyanate compounds having three or more isocyanate group such as triphenylmethane-4,4',4"-triisocyanate, 1,3,5-triisocyanatobenzene, 2,4,6-triisocyanatotoluene, 4,4'-dimethyldiphenylmethane-2,2',5, 5'-tetraisocyanate and the like, adducts prepared by reacting a polyol such as ethylene glycol, propylene glycol, 1,4-butylene glycol, polyalkylene glycol, trimethylolpropane, hexanetriol and the like with a polyisocyanate compound in an excess amount of isocyanate group relative to hydroxy group in the polyol, biuret type adducts of hexamethyllenediisocyanate, isophoronediisocyanate, tolylenediisocyanate, xylylenediisocyanate, 4,4'-diphenylmethanediisocyanate, 4,4'-methylene bis (cyclohexylisocyanate) and the like, isocyanuric ring type adducts, and the like.

Of these, preferable examples may include isophoronediisocyanate, xylylenediisocyanate, tolylenediisocyanate, 1,6-hexamethylenediisocyanate, 2,2, 4-trimethylhexamethylenediisocyanate, 2,4,4-trimethylhexamethylenediisocyanate and the like.

Examples of the compound optionally used and having at least two hydroxyl groups in one molecule may include glycols such as ethylene glycol, propylene glycol, polyethylene glycol having a molecular weight of 6000 or less, polypropylene glycol having a molecular weight of 6000 or less, tetramethylene glycol, 1,4-butanediol, 1,3-butanediol, 2,3-butanediol, 1,2-butanediol, 3-methyl-1,2-butanediol, 1,2-pentanediol, 1,5-pentanediol, 1,4-pentanediol, 2,4-pentanediol, 2,3-dimethyltrimethylene glycol, tetramethylene glycol, 3-methyl-3,4-pentanediol, 3-methyl-4,5-pentanediol, 2,2,4-trimethyl-1,3-pentanediol, 1,6-hexanediol, 1,5-hexanediol, 1,4-hexanediol, 2,5-hexanediol, 1,4-cyclohexane dimethanol, neopentyl glycol, neopentyl glycol hydroxypivalate, 1,4-cyclohexane dimethanol, tricyclodecan dimethanol, polycaprolactone, hydrogenated bisphenol A, hydrogenated bisphenol F, alkylene oxide adducts of hydrogenated bisphenol A and hydrogenated bisphenol F, and the like; polyesterdiols such as bis (hydroxyethyl) terephthalate and the like, trihydric or more alcohols such as glycerin, trimethylolpropane, trimethyllolethane, diglycerin, triglycerin, 1,2,6-hexane triol, pentaerythritol, dipentaerythrital, sorbitol, mannitol and the like, polylactone polyols prepared by addition reaction of lactones such as ϵ-caprolactone with the above glycols and/or trihydric or more alcohols, and the like. These may be used alone or in combination.

Of these, polyethylene glycol, polycaprolactone, polypropylene glycol, tetramethylene glycol, trimethylol propane and the like are preferable.

The compounds ($A_1$) and ($A_2$) may preferably include liquid ones at room temperature, or ones having a melting point or softening point in the range of 150° C. or lower, particularly 130° C. or lower on the ground that an addition reaction of carboxyl group or phenol group in the resin ($B_1$) or ($B_2$) with vinyl ether group in ($A_1$) or ($A_2$) may easily take place.

Acid Group-containing Urethane Resin ($B_1$)

The acid group-containing urethane resin ($B_1$) is an urethane resin prepared by reacting a polyisocyanate compound, hydroxy acid compound having at least one hydroxyl group and at least one acid group in one molecule, and optionally a compound having at least one hydroxyl group in one molecule according to the known process, and essentially containing no free isocyanate group.

The above polyisocyanate compound may include the same ones as used in the unsaturated compound ($A_2$).

Examples of the above hydroxy acid compound may include dimethylol propionic acid, dimethylol butyric acid, dimethylol valeric acid, tartaric acid, 1,2-hydroxystearic acid, parahydroxybenzoic acid, salicylic acid, malic acid, lactic acid, hydroxyacetic acid, 2,2-dimethyl-3-hydroxypropionic acid, and the like.

Optionally, a compound containing one hydroxyl group in one molecule, for example, methanol, ethanol, propanol, butanol, hexanol, cyclohexanol, benzyl alcohol and the like, may be used alone or in combination.

The acid group-containing urethane resin (B$_1$) has a weight average molecular weight in the range of about 1,000 to about 200,000, preferably about 5,000 to about 150,000, more preferably about 20,000 to about 100,000, and has an acid group content in the range of about 0.5 to about 10 equivalents, preferably about 0.5 to about 8 equivalents, more preferably about 0.5 to about 5 equivalents per one kg of the resin. An acid group content less than about 0.5/kg results in that a coating film formed by heating prior to irradiation of an actinic ray may show an unsatisfactory degree of crosslinking, and that a low solubility of an actinic ray-irradiated area in an alkali developing solution may reduce developing properties. On the other hand, when more than about 10 equivalents, the composition may show poor storage stability.

The resin (B$_2$) in the present invention may include (a) a carboxyl group and hydroxyphenyl group-containing polyemer, (b) a carboxyl group-containing polymer, (c) a hydroxyphenyl group-containing polymer and mixtures thereof.

Carboxyl Group and Hydroxyphenyl Group-containing Polymer (a):

The polymer (a) is a film-forming polymer having at least one carboxyl group and at least one hydroxyphenyl group in one molecule, and may include a copolymer of hydroxystyrene such as p-hydroxystyrene and the like with a carboxyl group-containing polymerizable unsaturated monomer; a copolymer of hydroxystyrene, carboxyl group-containing monomer and other copolymerizable monomer, and the like.

Examples of the carboxyl group-congtaining polymerizable unsaturated monomer may include acrylic acid, methacrylic acid, crotonic acid, itaconic acid, and the like. Examples of other copolymerizable monomer may include C$_{1-12}$ alkyl esters of (meth)acrylic acid, for example, methyl (meth)acrylate, ethyl (meth)acrylate, propyl (meth)acrylate, butyl (meth)acrylate, hexyl (meth)acrylate, octyl (meth) acrylate, 2-ethylhexyl (meth)acrylate, nonyl (meth)acrylate, decyl (meth)acrylate and the like; C$_{2-6}$ hydroxyalkyl esters of (meth)acrylic acid, for example, hydroxyethyl (meth) acrylate, 2-hydroxypropyl (meth)acrylate, 3-hydroxypropyl (meth)acrylate, hydroxybutyl (meth)acrylate, and the like; vinyl aromatic compounds such as styrene, α-methylstyrene, p-tert-butylstyrene and the like; vinyl acetate, (meth)acrylonitrile, (meth)acrylamide, vinyl pyrrolidone, and the like. These monomers may be used alone or in combination.

The polymer (a) may also include a polymer prepared by condensation reaction with formaldehyde of phenolcarboxylic acids such as hydroxybenzoic acid, gallic acid, resorcinic acid and the like, or of mixtures thereof with at least one of phenol, C$_{1-18}$ mono-, or dialkylphenol or naphthols and phenols selected from resorcin, catecohl and the like.

The polymer (a) usually has a weight average molecular weight in the range of about 1,000 to about 200,000, particularly about 20,000 to about 100,000, a carboxyl group content in the range of generally about 0.5 to about 10 equivalents, particularly about 0.5 to about 5.0 equivalents per one kg of the polymer, and a hydroxyphenyl group content in the range of at least about 1.0 equivalent, particularly about 2.0 to about 8.0 equivalents.

A carboxyl group content less than about 0.5 equivalent/kg results in that a coating film formed by heating prior to irradiation of an actinic ray may show an unsatisfactory degree of crosslinking, and that a low solibility of an actinic ray-irradiated area in an alkali developing solution may reduce developing properties. On the other hand, when more than about 10 equivalents/kg, the composition may show poor storage stability. On the other hand, a hydroxyphenyl group content less than about 1.0 equivalent/kg may result unsatisfactory degree of crosslinking on crosslinking.

The polymer preferably has a glass transition temperature (Tg) in the range of about 0° C. or higher, particularly about 5 to about 70° C. When the Tg is lower than about 0° C., a sticky coating film may result adhesion of foreign particles, dust, etc. so as to be difficult to handle.

Carboxyl Group-containing Polymer (b):

The polymer (b) is a film-forming polymer containing at least one carboxyl group in one molecule, and may include, for example; a homopolymer of a carboxyl group-containing polymerizable unsaturated monomer, a copolymer of the carboxyl group-containing monomer with other copolymerizable monomer; resins having carboxyl group in a molecular chain or at a molecular terminal and based on polyester, polyurethane, polyamide, and the like.

Examples of the carboxyl group-containing polymerizable unsaturated monomer may include acrylic acid, methacrylic acid, crotonic acid, itaconic acid, and the like. Examples of the other monomer copolymerizable with the above carboxyl group-containing monomer may include C$_2$–C$_6$ hydroxyalkyl esters of (meth)acrylic acid, for example, methyl (meth)acrylate, ethyl (meth)acrylate, propyl (meth)acrylate, butyl (meth)acrylate, hexyl (meth) acrylate, octyl (meth)acrylate, 2-ethylhexyl (meth)acrylate, nonyl (meth)acrylate, decyl (meth)acrylate and the like; vinyl aromatic compounds such as styrene, α-methylstyrene, p-tert-butylstyrene and the like; vinyl acetate, (meth)acrylonitrile, (meth)acrylamide, vinyl pysrolidone and the like. These monomers may be used alone or in combination. Particularly preferable other monomers, from the standpoints of precision of an image pattern to be formed, etching-resistant properties etc., may include vinyl aromatic compounds such as styrene, α-styrene, C$_2$–C$_6$ alkyl-substituted styrene such as p-tert-butylstyrene and the like, and the like.

The carboxyl group-containing polymer (b) has a weight average molecular weight in the range of generally about 1,000 to about 200,000, particularly about 20,000 to about 100,000, and has a carboxyl group content in the range of generally about 0.5 to about 10 equivalents, particularly about 0.5 to about 5.0 equivalents per one kg of the polymer. A carboxyl group content less than about 0.5 equivalents/kg may result in that a coating film formed by heating prior to irradiation of a visible light may show an unsatisfactory degree of crosslinking, and that a low solubility of an irradiated area in an alkali developing solution may reduce developing properties. On the other hand, when more than about 10 equivalents, the composition may show poor storage stability.

The polymer (b) preferably has a glass transition temperature (Tg) in the range of about 0° C. or higher, particularly about 5 to about 70° C. When the Tg is lower than about 0° C., a sticky coating film may result adhesion of foreign particles, dust, etc. so as to be difficult to handle.

The polymer (b) may be used in combination with the following hydroxyphenyl group-containing polymer (c).

Hydroxyphenyl Group-containing Polymer (c):

The polymer (c) is a polymer containing at least one hydroxyphenyl group in one molecule, and may include, for example, condensation products of monofunctional or polyfunctional phenol compound, alkylphenol compound or mixtures thereof with carbonyl compound such as formaldehyde, acetone and the like; homopolymer of hydroxyl group-containing vinyl aromatic compound such as p-hydroxystyrene; copolymer of the hydroxyl group-containing vinyl aromatic compound with copolymerizable monomer, and the like.

Examples of the monofunctional or polyfunctional phenol compound may include compounds having 1 to 3 hydroxyl groups on the benzene ring, for example, phenol, o-cresol, m-cresol, p-cresol, 3,5-xylenol, 2,6-xylenol, 2,4-xylenol, catecohl, resorsin, pyrogallol, bisphenol A and the like. Examples of the alkyl phenol compound may include $C_{1-10}$ alkyl phenol, preferably $C_{1-4}$ alkylphenol, for example, p-isopropylphenol, p-tert-butylphenol, p-tert-amylphenol, p-tert-octylphenol and the like.

A condensation reaction of the above compounds with a carbonyl compound such as formaldehyde, acetone and the like may be carried out by the known process, so that the condensation in the presence of an alkali catalyst may result insoluble and non-fusible resol type ones as the condensation reaction proceeds, and that the condensation in the presence of an acid catalyst may result soluble and fusible novolak type ones. The novolak type phenol resin is such that a molecular weight thereof may be increased as the condensation reaction proceeds, and preferably may include ones prepared by carrying out the condensation reaction for 1 to 3 hours, and having a weight average molecular weight in the range of 500 to 2,000.

The other monomer copolymerizable with the hydroxyl group-containing vinyl aromatic compound may include the same other copolymerizable monomer as exemplified in the case of the copolymer in the above polymer (b).

The hydroxyphenyl group-containing polymer (c) preferably has a weight average molecular weight in the range of generally about 1,000 to about 200,000, particularly about 1,000 to about 30,000.

The polymer (c) preferably has a hydroxyphenyl group content in the range of generally about 1.0 to about 10 equivalents, particularly about 2.0 to about 8.0 equivalents per one kg of the polymer. A hydroxyphenyl group content less than about 1.0 equivalent/kg may result in that a coating film formed by heating prior to irradiation of a visible light may show an unsatisfactory degree of crosslinking. On the other hand, when more than about 10 equivalents/kg, a resist film may be brittle.

As in the polymers (a) and (b), the polymer (c) preferably has a glass transition temperature (Tg) in the range of about 0° C. or higher, particularly about 5 to 70° C. When the Tg is lower than about 0° C., a sticky coating film may result adhesion of foreign particles, dust, etc. so as to be difficult to handle.

A mixing ratio of the compound ($A_1$) to the acid group-containing urethane resin ($B_1$), i.e. the compound ($A_2$)/resin ($B_1$); the compound ($A_2$) to the resin ($B_2$), i.e. the compound ($A_2$)/resin ($B_1$); or the compound ($A_2$) to the resin ($B_1$), i.e. the compound ($A_2$)lresin ($B_1$) is in the range of 0.5 to 50/99.5 to 50% by weight, preferably 1 to 30/99 to 70% by weight, more preferably 1 to 15/99 to 85% by weight based on a total weight of the compound ($A_1$) and the resin ($B_1$), the compound ($A_2$) and the resin ($B_2$), or the compound ($A_2$) and the resin ($B_1$) respectively. An amount less than 0.5% by weight of the compound ($A_1$) or ($A_2$), or more than 99.5% by weight of the resin ($B_1$) or ($B_2$) may undesirably reduce developing solution-resistant properties in a non-irradiated area. On the other hand, an amount more than 50% by weight of the compound ($A_1$) or ($A_2$), or less than 50% by weight of the resin ($B_1$) or ($B_2$) may undersirably reduce sensitivity and storage stability.

Photo-acid Generator(C)

The generator (C) is a compound to generate an acid on irradiation of an actinic ray, is such that the resin may be decomposed in the presence of the generated acid as a catalyst, and may include ones known in the art.

Examples of the compounds and mixtures thereof to be used as the photo-acid generator (C) may include diazonium, phosphonium, sulfonium and iodonium salts; halides; combinations of an organometal and organohalogen; benzoin and o-nitrobenzyl esters of a strong acid such as toluene sulfonic acid and the like; N-hydroxy amido and N-hydroxyimidosulfonates as disclosed in U.S. Pat. No. 4,371,605; and the like, and also may include arylnaphthoquinone-diazido-4-sulfonates. A preferable photo-solubilizing agent may include diaryliodonium and triarylsulfonium salts. Generally, these compounds may present in the form of the salts of multialloymetalhalide ions such as tetrafluoroborate, hexafluoroantimonate, hexafluoroarsenate, hexafluorophosphite, and the like.

Other effective groups of the acid generator showing photo-curability may include the oligomers and polymers, to which an anionic group having an aromatic onium acid generator as positive pair ions is added. The above polymers may also include polymers disclosed at column 9, lines 1–68, and column 10, lines 1–14 in U.S. Pat. No. 4,661,429 (as herein referred to).

For the purpose of controlling a spectrum sensitivity to an applicable wave length of the actinic ray, a sensitizer may preferably be added to the above system. Necessity of the above addition may depend on requirements in the system and specified photocurable compounds to be used. For example, in the case of iodonium and sulfonium salts responding to only a wave length less than 300 nm, use of benzophenone and derivatives thereof, polycyclic aromatic hydrocarbons such as perylene, pyrene and anthracene, dirivatives thereof, etc. makes it possible to be photocurable in a longer wave length. The decomposition of diaryliodonium and triarylsulfonium salts may also be made photocurable by use of bis-(p-N,N-dimethylaminopentylidene)-acetone. A sulfonium salt bonded to anthracene having a chain length consisting of 34 atoms is an effective photo-solubilizing agent. The compounds disclosed in M. G. Tilley's doctoral thesis, North Dakota State University, Fargo, N.D. (1988) [Diss, Abstr. Int. B, 49,8791 (1989): Chem. Abstr. 111, 39942u] are preferable photo-solubilizing agents. Other preferable acid generator may include ATASS, i.e. 3-(9-anthracenyl)propyl-diphenylsulfonium hexafluoroantimonate, which is such that anthracene and the sulfonium salt are bonded through a chain consisting of 3 carbon atoms. Additional examples of the acid generator to herein be used may include diphenyliodonium tosylate, benzoin tosylate and triarylsulfonium hexafluoroantimonate.

Additional examples of the acid generator may include iron-allene complexes, ruthenium-allene complexes, silanol-metal chelate complexes, triazine compounds, diazidonaphthoquinone compounds, sulfonates, imidosulfonate, halogenated compounds, and the like, and may also include the acid generators described in Japanese Patent Application Laid-Open No. 146552/95 and Japanese Patent Application No. 289218/97.

A mixing amount of the acid generator may be in the range of about 0.1 to 40 part by weight, particularly about 0.2 to 20 part by weight per 100 parts by weight of a total amount of the compound ($A_1$) and the resin ($B_1$), the compound ($A_2$) and the resin ($B_2$), or the compound ($A_2$) and the resin ($B_1$).

The positive type actinic ray-decomposing and developing resin composition used in the dry film of the present invention may include an organic solvent based resin composition prepared by dispersing or dissolving the above components, or finely dispersing fine pigment particles in the case where the pigment is used as a colorant, into an organic solvent respectively.

Examples of the organic solvent used for dissolving or dispersing the above components may include ketones such as acetone, methyl ethyl ketone, methyl isobutyl ketone and the like; esters such as ethyl acetate, butyl acetate, methyl benzoate, methyl propionate and the like; ethers such as tetrahydrofuran, dioxane, dimethoxyethane and the like; celiosolves such as methylcellosolve, ethylcellosolve, diethylene glycol monomethyl ether and the like; aromatic hydrocarbons such as benzene, toluene, xylene, ethylbenzene and the like; halogenated hydrocarbons such as chloroform, trichloroethylene, dichloromethane and the like; alcohols such as ethyl alcohol, benzyl alcohol and the like; others such as demethylformamide, dimethylsulfoxide and the like; and the like.

The above resin composition may also include a water-based resin composition prepared by neutralizing the carboxyl group in the resin composition with a basic compound, followed by dissolving or dispersing the neutralized product into water.

The resin composition used in the dry film of the present invention may be in the form of a solid at room temperature when dried.

In the presence of an acid which is generated on exposing a coating film formed from the resin composition used in the dry film of the present invention to actinic ray, an acid hydrolysis reaction may take place in an exposed area. For the purpose of smoothly proceeding the acid hydrohysis reaction, presence of water is desirable, and addition to the resin composition of a hydrophilic resin such as polyethylene glycol, polypropylene glycol, methylcellulose, ethylcellulose and the like makes it possible to easily introduce the water necessary for the above reaction into the resulting coating film. An amount of the hydrophilic resin may be in the range of generally 20 parts by weight or less, preferably 0.1 to 10 parts by weight per 100 parts by weight of the resin component.

In addition to the above components, the resin composition used in the present invention may optionally contain the other resins which are insoluble, soluble or dispersible in water or an organic solvent, and improve or impair solubility in the organic solvent or an aqueous developing solution. Examples of the other resins may include phenolic resin, polyester resin, acrylic resin, vinyl resin, vinyl acetate resin, epoxy resin, silicone resin, fluorocarbon resin, mixtures thereof, modified products thereof, and the like.

For the purpose of imparting suitable flexibility, non-tackiness, tackiness and the like to the resulting dry film, the resin composition used in the present invention may contain plasticizers such as phthalate and the like, polyester resin, acrylic resin, and the like.

The resin composition used in the present invention may optionally contain flowability regulators, plasticizers, dyes, coloring agents such as pigments and the like, and the like.

The method of the present invention may be applicable to any uses without particular limitations, so long as the above steps are included.

The coating substrate used in the present invention may include substrates of conductor, insulator, semiconductor, combination thereof as used in the following uses.

Examples of the above uses in respective industrial fields may include electrical fields such as electrical parts, lightings, electrical elements, semiconductors, printings, printed circuits, electronic communications, electric powers and he like; physical fields such as instrumentations, optical field, indications, acoustic field, controllings, vending field, signals, information recording field, and the like; chemistry.metallurgy.fiber fields such as inorganic chemistry, organic chemistry, polymer chemistry, metallurgy, fiber and the like; treatment.transportation fields such as separation.mixing, metal processing, plastics processing, printings, containers, packings and the like; articles for living, for example, agricultural and marine fields, foods fermentations, domestic articles, health.amusement fields, and the like; mechanical engineering, and the like.

The method of the present invention is a method of forming a pattern which comprises the following steps:
(1) applying the positive type actinic ray-decomposing and developing dry film as above described onto the surface of a coating substrate so that the surface of the coating substrate may face to the urethane resin layer of the dry film,
(2) optionally stripping the nonactinic ray-decomposing and developing substrate of the dry film,
(3) irradiating an actinic ray through a mask or directly onto the surface of the dry film so as to obtain an intended pattern, optionally heat treating,
(4) stripping the nonactinic ray-decomposing and developing substrate not stripped in the above step (2),
(5) subjecting the positive type actinic ray-decomposing and developing urethane resin layer to a developing treatment, and
(6) removing an unnecessary area of the urethane resin layer to form a resist pattern film, either step (1) or (2) including a step of heat.

The dry film may be applied onto the coating substrate so that the positive type actinic ray-decomposing and developing resin coating film layer may face to the surface of the coating substrate such as a conductive circuit board having non-through and/or through-holes and may be laminated thereonto, followed by heat laminating while pressuring onto the surface of the substrate in the dry film so as to bond the conductive substrate to the surface of the resin coating film layer. Heat laminating step may be carried out by heating the conductive substrate, heating from the surface of the substrate in the dry film, or both. The heating temperature may be in the range of usually 60 to 150° C., particularly 80 to 120° C.

On applying the dry film to the surface of the coating substrate, treatment of the surface of the substrate with a liquid, for example, an adhesive-promoting solution as described in Jones (U.S. Pat. No. 3,645,772), a solvent for use in a resist film as described in Fickes, or a swelling agent makes it possible to improve adhesion properties between the surface of the coating substrate and the dry film. The above liquid may have photo-decomposing and developing properties as the photoresist solution disclosed in Isaacson (U.S. Pat. No. 3,629,036). The application of the dry film to the coating substrate may be carried out by use of a vacuum-laminating apparatus.

The above heat treatment may be carried out at such temperature conditions that a crosslinking reaction between the compound ($A_1$) and the acid group-containing urethane resin ($B_1$), the compound ($A_2$) and the resin ($B_2$), or the compound ($A_2$) and the resin ($B_1$) may substantially take place, for example, by heating at about 60° C. to about 150° C. for about one minute to about 30 minutes.

Irradiation of the actinic ray may be carried out, for example, by a method of irradiating the actinic ray through a photomask, a method of directly drawing by laser scanning, and the like.

Examples of the actinic ray may include ultraviolet light, visible light, laser beam such as near ultrared rays, visible light laser, ultraviolet light laser and the like. An irradiation dose may be in the range of usually 0.5 to 2000 mJ/cm$^2$, preferably 1 to 1000 mJ/cm$^2$.

An irradiation source of the actinic ray may include ones known in the art, for example, light sources obtained from ultrahigh pressure mercury lamp, high pressure mercury lamp, moderate pressure mercury lamp, low pressure mercury lamp, chemical lamp, carbon arc lamp, xenone lamp, metal halide lamp, fluorescent tube, tungsten lamp, sunlight and the like; lights in visible light range as cut by a ultraviolet light-cut filter, various lasers having an oscillating curse in the visible light range, and the like. A high power and stable laser beam source may preferably include argon laser and YAG-SHG laser.

After the application of the dry film onto the surface of the coating substrate, the substrate of the dry film may optionally be stripped from the positive type actinic ray-decomposing and developing resin coating film layer. The stripping step may optionally be carried out after the following actinic ray-irradiating step.

Irradiation of the actinic ray may preferably be followed by such a heat treatment as to heat under such temperature conditions that the crosslinked structure of the cured coating film may be broken in the presence of the acid generated on irradiation, for example, about 60° C. to about 150° C. for about one minute to 30 minutes.

The developing treatment may be carried out by washing out the resist film in an exposed area with an aqueous alkali solution, organic solvent, water or the like. The aqueous alkali solution may include aqueous solutions of alkaki such as caustic soda, sodium carbonate, caustic potash, ammonia, etc. The organic solvent to dissolve the exposed area may include, for example, 1,1,1-trichloroethane, trichloroethylene, methyl ethyl ketone, methylene chloride and the like. After the developing treatment, the resist film is washed with water, followed by drying with hot air or the like to form an intended image on the conductor. Optionally, etching may be carried out to remove a conductor in an exposed area and to prepare a printed circuit board. For example, in the case where a conductive film in the printed circuit board is copper, the conductive film in the exposed area may be removed by etching, that is, by use of an acid etching solution such as a cupric chloride solution and he like, and an alkaline etching solution such as an ammonia water and the like. According to the present invention, no dissolution of copper in the interior of the through-hole takes place without resulting breaking.

After the etching step, a remaining resist film may optionally be removed. The removal of the remaining resist film may be carried out by use of a stripping agent, which dissolves the resist film, but essentially does not impair the substrate and a conductive film constituting a circuit pattern on the surface of the substrate, for example, by use of an aqueous solution of an alkali or acid, and various organic solvents.

In the case where a substrate having a conductive circuit pattern and a through-hole and/or non-through hole is used as the conductive substrate having the through-hole, a satisfactory covering of the resist film over the through-hole, non-through hole and fine circuit pattern makes it possible to easily form a solder resist and interlaminar insulating film with high reliability on electrical insulating properties, chemical resistant properties, etc.

According to the present invention, the use of a positive type dry film formed from a urethane linkage-containing, actinic ray-decomposing and developing resin composition provides such effects that neither cracks nor stripping of the actinic ray-decomposing and developing coating film develop on bending the dry film to be easily handled, and that developing and etching treatment make it possible to form a fine pattern.

EXAMPLE

The present invention is explained more in detail by the following Examples and Comparative Examples, in which "part" and "%" represent "part by weight" and "% by weight" respectively.

Preparation Example 1

Preparation of Vinyl Ether Group-containing Compound ($A_1$-1)

A 250 ml flask was charged with 45.6 parts of bisphenol A, 80 ml of 2-chloroethyl vinyl ether and 100 ml of toluene, followed by introducing nitrogen, charging 20 parts of sodium hydroxide, heating at 80° C. for 30 minutes, charging a solution prepared by dissolving 4.56 parts of tetrabutylammonium bromide into 20 ml of 2-chloroethyl vinyl ether, heating and reacting at 95° C. for 5 hours, washing a reaction product with deionized water three times, separating an oil layer, and evaporating and removing 2-chloroethyl vinyl ether and toluene to obtain a vinyl ether compound ($A_1$-1) having a weight average molecular weight of 368 and containing 2 vinyl ether groups in one molecule.

Preparation Example 2

Preparation of Vinyl Ether Urethane Based Compound ($A_2$-1)

A mixture of 210 parts of trimethylhexamethylene diisocyanate, 232 parts of hydroxybutyl vinyl ether and 5 drops of pyridine was reacted at 90° C. for 6 hours to obtain a divinyl ether compound ($A_2$-1).

Preparation Example 3

Preparation of Vinyl Ether Urethane Based Compound ($A_2$-2)

A mixture of 875 parts of a 75% ethylene glycol dimethyl ether solution of a polyisocyanate prepared by reacting one mole of trimethylolpropane with 3 moles of tolylenediisocyanate, and 264 parts of 2-hydroxyethyl vinyl ether was reacted in the presence of one part of dibutyltin diacetate at 35° C. for 3 hours to obtain a vinyl ether compound ($A_2$-2) containing 3 vinyl ether groups in one molecule and having a solid content of about 81%.

Preparation Example 4

Preparation of Acid Group-containing Urethane Resin ($B_1$-1)

A mixture of 275 parts of methyl ethyl ketone, 233 parts of trimethyl-hexamethylene diisocyanate, 108 parts of tripropylene glycol and 73 parts of dimethylolbutanic acid was reacted at 80° C. for 10 hours to obtain a reaction product, followed by reacting 24 parts of hydroxyacetic acid with the above reaction product at 75° C. for 11 hours to obtain a resin ($B_1$-1) having a weight average molecular weight of about 47,000 and a carboxy group content of 1,4 moles/kg i.e. an acid value of 79 mg KOH/g.

Preparation Example 5

Preparation of Acid Group-containing Urethane Resin ($B_1$-2)

A mixture of 596 parts of methyl ethyl ketone, 576 parts of isophorone diisocyanate, 81 parts of tripropylene glycol and 70 parts of dimethylolbutanic acid was reacted at 80° C. for 10 hours to obtain a resin ($B_1$-2) having a weight average molecular weight of about 40,000 and a hydroxyl group content of 1.6 moles/kg, i.e. an acid value of 88 mg KOH/g.

Preparation Example 6

Preparation of Carboxyl Group-containing Resin ($B_2$-1)

A mixture of 216 parts of acrylic acid, 500 parts of styrene, 284 parts of n-butylmethacrylate, and 50 parts of azobisisobutylonitrile was dropped into 600 parts of methyl isobutyl ketone heated at 80° C. and being stirred over 2 hours, followed by keeping at that temperature for 2 hours to obtain a polymer ($B_2$-1) having a solid content of about 62.5% and a carboxyl group content of 3 moles/kg.

Preparation Example 7

Preparation of Carboxyl Group-containing Resin ($B_2$-2)

A mixture of 288 parts of acrylic acid, 300 parts of styrene, 255 parts of n-butylacrylate, 157 parts of 2-hydroxyethylacrylate and 100 parts of t-butylperoxybenzoate was dropped into 1000 parts of 2-butoxyethanol heated at 110° C. and being stirred over 2 hours, followed by keeping at that temperature for 2 hours to obtain a polymer ($B_2$-2) having a solid content of about 50% and a carboxyl group content of 4 moles/kg.

Preparation Example 8

Preparation of Carboxyl Group and Hydroxyphenyl Group-containing Resin ($B_2$-3)

A mixture of 200 parts of tetrahydrofuran, 65 parts of p-hydroxystyrene, 28 parts of n-butylacrylate, 11 parts of acrylic acid and 3 parts of azobisisobutylonitrile was reacted at 100° C. for 2 hours to obtain a reaction product, followed by injecting the reaction product into 1500 ml of a toluene solvent, precipitating and separating the reaction product, and drying the precipitate at 60° C. to obtain a photo-curable resin ($B_2$-3) having a weight average molecular weight of about 5200 and a hydroxyphenyl group content of 4.6 moles/kg.

Preparation Example 9

Preparation of Hydroxyphenyl Group-containing Resin ($B_2$-4)

A flask was charged with 1490 parts of o-cresol, 1145 parts of 30% formalin, 130 parts of deionized water and 6.5 parts of oxalic acid, followed by heating under reflux for 60 minutes, adding 13.5 parts of 15% chloric acid, heating under reflux for 40 minutes, adding 400 parts of deionized water at about 150° C., keeping the resulting mixture at about 75° C. to precipitate a resin, adding 35% sodium hydroxyde solution, neutralizing, removing an aqueous layer, adding 400 parts of deionized water, washing the resin at 75° C., removing an aqueous layer, duplicating the same washing procedure 2 times, and drying at about 120° C. under vacuum to obtain a novolak phenol resin ($B_2$-4) having a weight average molecular weight of 600.

Example 1

A mixture of 90 parts of acid group-containing urethane resin ($B_1$-1), 10 parts of vinyl ether group-containing compound ($A_1$-1), five parts of photo-acid generator NAI__105 (trade name, marketed by Midori Kagamku Co., Ltd.) and two parts of 1, 2, 3-benzotriazole was dissolved in cyclohexanone to obtain a photo-decomposing and developing solution having a solid content of 28 percent.

The photo-decomposing and developing solution was coated onto a polyethylene terephthalate film to be a dry film thickness of 10 µm by a bar coater, followed by heating at 120° C. for 10 minutes to obtain a dry film. Performances of the dry film are shown in Table 1. The dry film was laminated onto a through-hole plated, both side coppercladed laminate by use of a dry film laminator, followed by stripping the polyethylene terephthalate film to obtain a coating substrate with a resist film. An ultraviolet light having an intensity of 50 mJ/cm$^2$ was irradiated through a positive type mask onto the substrate by use of a mercury lamp, followed by heating at 120° C. for 10 minutes, and developing with a 0.75 percent aqueous sodium carbonate solution. Results are shown in Table 1. Thereafter, etching was carried out with an aqueous cupric chloride solution at about 40° C., followed by removing the remaining resist film with a 3 percent aqueous caustic soda solution to obtain a printed circuit board. Results are shown in Table 1.

Examples 2 to 4 and Comparative Examples 1 to 2

Photo-decomposing and developing solutions were prepared according to the formulations shown in Table 1 respectively, followed by preparing dry films in the same manner as in Example 1, and subjecting respective dry films to the same tests as in Example 1. Results are shown in Table 1.

TABLE 1

|  |  | Examples | | | | Comparative Examples | |
|---|---|---|---|---|---|---|---|
|  |  | 1 | 2 | 3 | 4 | 1 | 2 |
| Formulations (part) | $A_1$-1 | 10 | 10 | 30 | 30 | 10 | 30 |
|  | $B_1$-1 | 90 |  | 70 |  |  |  |
|  | $B_1$-2 |  | 90 |  | 70 |  |  |
|  | $B_2$-1 |  |  |  |  | 90 | 70 |
|  | Photo-acid Generator | 5 | 5 | 5 | 5 | 5 | 5 |
|  | 1,2,3-benzo-triazole | 2 | 2 | 2 | 2 | 2 | 2 |
| Dry film performances | Application Workability | 2 | 2 | 2 | 2 | 2 | 2 |
|  | Tent-forming Properties | 2 | 2 | 2 | 2 | 1 | 1 |
| Developing Properties |  | 2 | 2 | 2 | 2 | 2 | 2 |
| Anti-etching properties |  | 2 | 2 | 2 | 2 | 1 | 1 |

Example 5

Example 1 was duplicated except that acid group-containing resin ($B_2$-1) and vinyl ether urethane based compound ($A_2$-1) were used. Results are shown in Table 2.

Examples 6–14 and Comparative Examples 3–7

Photo-decomposing and developing solutions were prepared according to the formulations shown in Table 2 respectively, followed by preparing dry films in the same manner as in Example 5, and subjecting respective dry films to the same tests as in Example 5. Results are shown in Table 2.

In Tables 1–3, formulations are all represented by "part". The same photo-acid generator as in Example 1 was used respectively.

TABLE 2

|  |  | Examples |  |  |  |  |  |  |  |  | Comparative Examples |  |  |  |  |
|---|---|---|---|---|---|---|---|---|---|---|---|---|---|---|---|
|  |  | 5 | 6 | 7 | 8 | 9 | 10 | 11 | 12 | 13 | 14 | 3 | 4 | 5 | 6 | 7 |
| Formulations (parts) | $A_2$-1 | 10 | 10 | 10 | 10 |  |  |  |  | 30 |  |  |  |  |  |  |
|  | $A_2$-2 |  |  |  |  | 10 | 10 | 10 | 10 |  | 30 |  |  |  |  |  |
|  | $B_2$-1 | 90 |  |  | 90 |  |  |  |  | 70 |  | 90 |  |  |  | 70 |
|  | $B_2$-2 |  | 90 |  |  | 90 |  |  |  |  | 70 |  | 90 |  |  |  |
|  | $B_2$-3 |  |  | 90 |  |  |  | 90 |  |  |  |  |  | 90 |  |  |
|  | $B_2$-4 |  |  |  | 90 |  |  |  | 90 |  |  |  |  |  | 90 |  |
|  | $A_1$-1 |  |  |  |  |  |  |  |  |  |  | 10 | 10 | 10 | 10 | 30 |
|  | Photo-acid Generator | 5 | 5 | 5 | 5 | 5 | 5 | 5 | 5 | 5 | 5 | 5 | 5 | 5 | 5 | 5 |
|  | 1,2,3-benzo-triazole | 2 | 2 | 2 | 2 | 2 | 2 | 2 | 2 | 2 | 2 | 2 | 2 | 2 | 2 | 2 |
| Dry film performance | application workability | 2 | 2 | 2 | 2 | 2 | 2 | 2 | 2 | 2 | 2 | 2 | 2 | 2 | 2 | 2 |
|  | tent-forming properties | 2 | 2 | 2 | 2 | 2 | 2 | 2 | 2 | 2 | 2 | 1 | 1 | 1 | 1 | 1 |
| Developing properties |  | 2 | 2 | 2 | 2 | 2 | 2 | 2 | 2 | 2 | 2 | 2 | 2 | 2 | 2 | 2 |
| Anti-etching properties |  | 2 | 2 | 2 | 2 | 2 | 2 | 2 | 2 | 2 | 2 | 1 | 1 | 1 | 1 | 1 |

Example 15

Example 1 was duplicated except that acid group-containing urethane resin ($B_1$-1) and vinyl ether urethane based compound ($A_2$-1) were used. Results are shown in Table 3.

Examples 15–22 and Comparative Examples 8–9

Photo-decomposing and developing solutions were prepared according to the formulations shown in Table 3 respectively, followed by preparing dry films in the same manner as in Example 15, and subjecting respective dry films to the same tests as in Example 15. Results are shown in Table 3.

Dry Film Performances Test Method

Application Workability

A dry film was press-bonded onto a surface-abrasive, copper-clad laminate by use of a laminater, followed by stripping a substrate. Evaluation was made as follows.

2: A resin layer is completely transferred onto the copper-clad laminate (good).

1: The resin layer partly or wholly remains on the substrate (failure).

Tent-Forming Properties

A dry film was press-bonded onto a surface-abrasive, copper-clad laminate having a through-hole by use of a

TABLE 3

|  |  | Examples |  |  |  |  |  |  |  | Comparative Examples |  |
|---|---|---|---|---|---|---|---|---|---|---|---|
|  |  | 15 | 16 | 17 | 18 | 19 | 20 | 21 | 22 | 8 | 9 |
| Formulations (part) | $A_2$-1 | 10 | 10 | 30 | 30 |  |  |  |  |  |  |
|  | $A_2$-2 |  |  |  |  | 10 | 10 | 30 | 30 |  |  |
|  | $B_1$-1 | 90 |  | 70 |  | 90 |  | 70 |  |  |  |
|  | $B_1$-2 |  | 90 |  | 70 |  | 90 |  | 70 |  |  |
|  | $A_1$-1 |  |  |  |  |  |  |  |  | 10 | 30 |
|  | $B_2$-1 |  |  |  |  |  |  |  |  | 90 | 70 |
|  | Photo-acid Generator | 5 | 5 | 5 | 5 | 5 | 5 | 5 | 5 | 5 | 5 |
|  | 1,2,3-benzo-triazole | 2 | 2 | 2 | 2 | 2 | 2 | 2 | 2 | 2 | 2 |
| Dry film performances | Application workability | 2 | 2 | 2 | 2 | 2 | 2 | 2 | 2 | 2 | 2 |
|  | Tent-forming Properties | 2 | 2 | 2 | 2 | 2 | 2 | 2 | 2 | 1 | 1 |
| Developing properties |  | 2 | 2 | 2 | 2 | 2 | 2 | 2 | 2 | 2 | 2 |
| Anti-etching properties |  | 2 | 2 | 2 | 2 | 2 | 2 | 2 | 2 | 1 | 1 | laminater, followed by stripping a substrate. Evaluation was made as follows.

2: A resin layer stretches over the through-hole to form a hollow (good).

1: The resin layer over the through-hole has breaks (failure).

Developing Properties

2: After developing, no resist residues remain on the coating substrate (good).

1: After developing, resist residues remain on the coating substrate (failure).

Anti-etching Properties

2: An etching treatment after developing shows no changes on a resist in a non-irradiated area including a hollow resin film on the through-hole (good).

1: The resist shows drawbacks such as swelling, dissolution, stripping and the like (failure).

What is claimed is:

1. A positive actinic ray-decomposing and developing dry film having, on the surface of a nonactinic ray-decomposing and developing substrate removed after application, a solid positive type actinic ray-decomposing and developing urethane resin layer formed by coating and heat-crosslinking (1) a resin composition containing, as essential components, ($A_1$) at least one unsaturated compound selected from the group consisting of a vinyl ether group-containing compound, vinyl ester group-containing compound and propenyl ester group-containing compound, ($B_1$) an acid group containing urethane resin having a weight average molecular weight of 1,000 to 200,000 and an acid group content in the range of 0.5 to 10 equivalents per one kg of the resin, and (C) a photo-acid generator, (2) a resin composition containing, as essential components, ($A_2$) at least one unsaturated urethane based compound selected from the group consisting of a vinyl ether uretriane based compound, vinyl ester urethane based compound and propenyl ester urethane based compound, ($B_2$) at least one resin selected from the group consisting of (a) a carboxyl group and hydroxyphenyl group-containing polymer, (b) a carboxyl-group containing polymer and (c) a hydroxyphenyl group-containing polymer, and (C) a photo-acid generator, or (3) a resin composition containing, as essential components, ($A_2$) at least one unsaturated urethane based compound selected from the group consisting of a vinyl ether urethane based compound, vinyl ester urethane based compound and propenyl ester urethane based compound, ($B_1$) an acid-group containing urethane resin having a weight average molecular weight of 1,000 to 200,000 and an acid group content in the range of 0.5 to 10 equivalents per one kg of the resin, and (C) a photo-acid generator, the acid group-containing urethane resin ($B_1$) being prepared by reacting a polyisocyanate, dimethylobutyric acid and a glycol, the vinyl ether urethane based compound being prepared by reacting a polyisocyanate compound, dimethylobutyric acid and glycol.

2. A dry film as claimed in claim 1, wherein the carboxyl group and hydroxyphenyl group-containing polymer (a) has a weight average molecular weight of 1,000 to 200,000, a carboxyl group content in the range of 0.5 to 10 equivalents per one kg of the polymer and a hydroxyphenyl group content in the range of 1.0 to 10 equivalents per one kg of the polymer.

3. A dry film as claimed in claim 1, wherein the carboxyl group-containing polymer (b) has a weight average molecular weight in the range of 1,000 to 200,000, and a carboxyl group content in the range of 0.5 to 10 equivalents per one kg of the polymer.

4. A dry film as claimed in claim 1, wherein the hydroxyphenyl group-containing polymer (c) has a weight average molecular weight in the range of 1,000 to 200,000, and a hydroxyphenyl group content in the range of 1.0 to 10 equivalents per one kg of the polymer.

* * * * *